(12) United States Patent
Netzel, Sr. et al.

(10) Patent No.: US 7,628,512 B2
(45) Date of Patent: Dec. 8, 2009

(54) LED POOL AND SPA LIGHT

(75) Inventors: Robert J. Netzel, Sr., Simi Valley, CA (US); Daniel A. Armstrong, Simi Valley, CA (US); Louis F. Teran, Granada Hills, CA (US); Jeffrey S. Barsamian, Thousand Oaks, CA (US); Dennis C. Dunn, Thousand Oaks, CA (US); Abhinay Agarwal, Rajendra Nagar (IN)

(73) Assignee: Pentair Water Pool and Spa, Inc., Sanford, CT (US)

( * ) Notice: Subject to any disclaimer, the term of this patent is extended or adjusted under 35 U.S.C. 154(b) by 87 days.

(21) Appl. No.: 11/586,890

(22) Filed: Oct. 26, 2006

(65) Prior Publication Data

US 2007/0159833 A1    Jul. 12, 2007

Related U.S. Application Data

(60) Provisional application No. 60/730,457, filed on Oct. 26, 2005.

(51) Int. Cl.
*F21V 29/00*    (2006.01)
*F21V 23/04*    (2006.01)

(52) U.S. Cl. .................. 362/267; 362/247; 362/249.05; 362/276; 362/294; 362/311.02

(58) Field of Classification Search .................. 362/96, 362/101, 247, 251, 267, 276, 294, 394, 234, 362/249.05, 311.02
See application file for complete search history.

(56) References Cited

U.S. PATENT DOCUMENTS 4,168,877 A * 9/1979 Little et al. .................. 439/347

(Continued)

FOREIGN PATENT DOCUMENTS

DE    3135861    3/1983

(Continued)

OTHER PUBLICATIONS

High Efficiency Radiation Hole with Metal Core Printed Wiring Board; IBM Technical Disclosure Bulletin, vol. 33, No. 7, Dec. 1990, pp. 48-51.

*Primary Examiner*—Stephen F Husar
*Assistant Examiner*—James W Cranson
(74) *Attorney, Agent, or Firm*—Greenberg Traurig

(57) ABSTRACT

A lighting fixture includes a heat sink having a first mounting portion attached to a housing. A first circuit board containing LEDs is mounted to a first side of a second mounting portion of the heat sink. A second circuit board include an LED control circuit is mounted to a second side of the second mounting portion. A multi-layer circuit board includes a heat-dissipating core bonded to first and second dielectric substrates, which are bonded to first and second electrically conductive layers. An electrical conductor extends through a through-hole in the board to electrically connect the first and second conductive layers. An electrical insulator inside the through-hole electrically isolates the core from the conductor. A transparent cover is shaped to cause downwardly projecting light rays emitted from the LEDs to be refracted less than upwardly projecting light rays. The cover also includes vertically extending projections for horizontally refracting light.

22 Claims, 10 Drawing Sheets

U.S. PATENT DOCUMENTS

| | | |
|---|---|---|
| 6,967,448 B2 | 11/2005 | Morgan et al. |
| 6,984,944 B2 | 1/2006 | Garrity |
| 7,125,146 B2 * | 10/2006 | Willis et al. .................. 362/267 |
| 7,233,831 B2 | 6/2007 | Blackwell |
| 2005/0035728 A1 | 2/2005 | Schanberger et al. |

FOREIGN PATENT DOCUMENTS

| | | |
|---|---|---|
| DE | 200 07 235 | 4/2000 |
| EP | 0 139 431 | 5/1985 |
| EP | 0446365 | 4/1991 |
| GB | 2020970 | 11/1979 |
| GB | 1 137 422 | 10/1984 |
| JP | 52022540 | 8/1993 |
| JP | 2000-216307 | 4/2000 |
| SU | 889131 | 12/1981 |

* cited by examiner

LED POOL AND SPA LIGHT

CROSS-REFERENCE TO RELATED APPLICATION(S)

The present application is a non-provisional of U.S. Provisional Patent Application No. 60/730,457 filed on Oct. 26, 2005, which is incorporated by reference herein.

BACKGROUND OF THE INVENTION

Until recently light emitting diode (LED) light sources were not in common use due to the lack of inexpensive LEDs having sufficient light output to serve as a substitute for incandescent, fluorescent and other conventional light sources. Further, the lack of blue and white LEDs limited the use of LEDs in conventional lighting applications.

Due to the wide availability of high output LEDs, as well as blue and white LEDs, LEDs are becoming increasingly popular for use as light sources in conventional lighting applications. LEDs have several advantages over incandescent and other conventional light sources, including increased energy efficiency, longer life, decreased heat generation, and other advantages.

However, a lighting fixture, such as for a pool or spa, comprising an array of LEDs acts quite differently from a conventional incandescent or halogen lamp. As a source, the LED array is much larger than the filament of a conventional lamp. Also, the light from a single LED emanates from an intense spot. The beams must be combined and shaped to allow for refraction when entering, and passage through, water on the way to illuminating the spa or pool walls and floor. The shaping must also avoid loss of light from the upper water surface in order to deliver sufficient illumination to the pool. The individual LED beams must conditioned by mixing in order to lower the spot light intensity delivered to the eye of an observer.

Conventional methods of controlling LED lights utilize pulse width modulated (PWM) control to vary the power, and thus the output intensity of the LEDs.

BRIEF SUMMARY OF THE INVENTION

According to an aspect of the present invention, a lighting fixture comprises a housing having an interior cavity and an opening; a transparent cover attached to the housing and covering the opening; a heat sink including a first mounting portion and a second mounting portion, the first mounting portion being attached to the housing within the interior cavity, the second mounting portion having a first side and a second side opposite the first side; a first circuit board mounted to the first side of the second mounting portion; a lighting assembly including an LED light source, the LED light source include a plurality of LEDs mounted to the first circuit board; and a second circuit board mounted to the second side of the second mounting portion, the second circuit board including at least of portion of a control circuit, the control circuit being operatively connected to the LED light source for selectively providing power to each of the plurality of LEDs.

According to a further aspect of the present invention, an electrical circuit board comprises a heat-dissipating core having a first side and a second side opposite the first side; a first dielectric substrate having an outer side and an inner side opposite the outer side, the inner side being bonded to the first side of the heat-dissipating core; a first electrically conductive layer bonder to the outer side of the first dielectric substrate; a second dielectric substrate having an outer side and an inner side opposite the outer side, the inner side being bonded to the second side of the heat-dissipating core; a second electrically conductive layer bonded to the outer side of the second dielectric substrate; a through-hole extending through the first electrically conductive layer, the first dielectric substrate, the heat-dissipating core, the second dielectric and the second electrically conductive layer; an electrical conductor extending through the through-hole and having a first end electrically connected to the first electrically conductive layer and a second end electrically connected to the second electrically conductive layer, thereby providing an electrical connection between the first electrically conductive layer and the second electrically conductive layer; and an electrical insulator provided inside of the through-hole and being interposed between the heat-dissipating core and the electrical conductor to electrically isolate the heat-dissipating core from the electrical conductor. The first dielectric substrate and the second dielectric substrate are thermally conductive.

According to a further aspect of the present invention, a lighting fixture comprises a housing having an interior cavity and an opening; a transparent cover attached to the housing and extending across the opening of the housing; and a light source projecting a beam of light toward the opening, the beam including first light rays projecting upward toward the transparent cover and second light rays projecting downward toward the transparent cover. The transparent cover is shaped to cause the second light rays to be refracted more than the first light rays.

According to a further aspect of the present invention, lighting fixture comprises a housing having an interior cavity and an opening; a transparent cover attached to the housing and extending across the opening of the housing, the transparent cover including a plurality of vertically extending projections distributed across a surface of the transparent cover; and a plurality of light source for projecting a beam of light toward the opening. The projections are shaped to cause the beam of light to be refracted horizontally.

According to a further aspect of the present invention, a lighting fixture comprises a housing having an interior cavity and an opening; a transparent cover attached to the housing and extending across the opening of the housing; a reflector array including a plurality of reflectors, each of the plurality of reflectors including a first open end, a second open end, and first and second reflective surface each extending between the first open end and the second open end, the first reflective surface facing the second reflective surface; a light source comprising a plurality of rows of LEDs each including a plurality of LEDs, each of the rows projecting light into the first open end of an associated one of the plurality of reflectors, wherein the light projected by each row of LEDs is reflected by the first and second reflective surfaces of the associated reflector causing the light to pass through the second open end of the associated reflector and through the transparent cover.

According to a further aspect of the present invention, a lighting fixture comprises a housing having an interior cavity and an opening; a transparent cover attached to the housing and covering the opening; a lighting assembly including an LED light source, the LED light source include a plurality of LEDs; and a control circuit operatively connected to the LED light source for selectively providing power to each of the plurality of LEDs. The control circuit includes: a microcontroller having an input connected to sense an alternating current source and a plurality of outputs for controlling the plurality of LEDs; a plurality of multiplexers each having a plurality of outputs and an input connected to one of the plurality of outputs of the microcontroller; and a plurality of electronic switches each having a control input and a power output, each power output being connected to selectively power one of the plurality of LEDs, each of the control inputs being connected to one of the plurality of outputs of one of the plurality of multiplexers. The microcontroller can individually and selectively control power to each of the plurality of LEDs.

DETAILED DESCRIPTION OF EXAMPLE EMBODIMENTS OF THE INVENTION

According to an example embodiment of the present invention, a submersible lighting fixture is provided for a swimming pool, spa, or other application. The lighting fixture generally includes an light-emitting diode (LED) lamp assembly, a reflector array, a housing, a lens, and a heat dissipation assembly. The lamp includes an array of red, blue, and green LEDs. By controlling and mixing the output of the LEDs, the lighting fixture produces light of varying colors.

FIGS. 1-4 schematically illustrate various aspects of an optical system according an example embodiment of the present invention. The optical system is designed to shape and condition a light beam of a submersible lighting fixture to provide generally even illumination of walls and a floor of basin containing water, such as a swimming pool, spa or the like (not shown).

Figure 1:
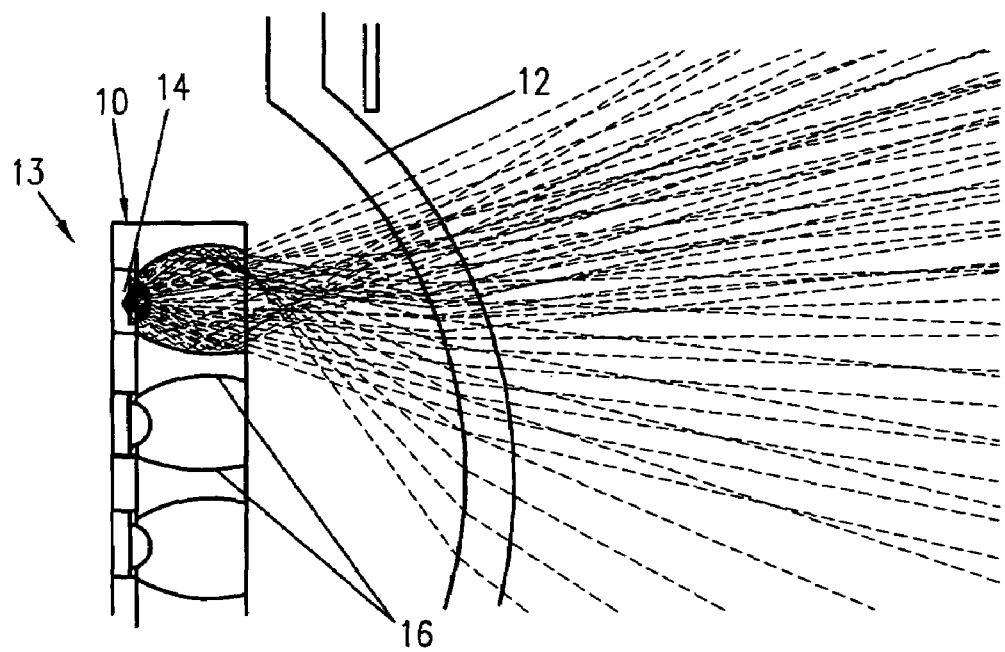
FIG. 1 is a side view of a portion of a portion of a lighting fixture schematically illustrating an optical system according to an example embodiment of the present invention.
Figure 2:
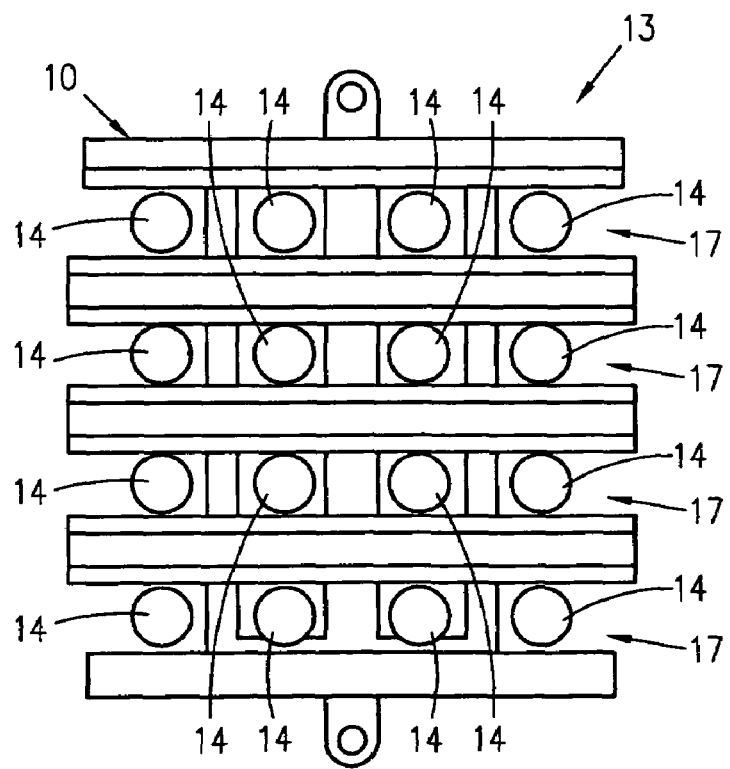
FIG. 2 is front view of a reflector array of the lighting fixture of FIG. 1.
Figure 3:
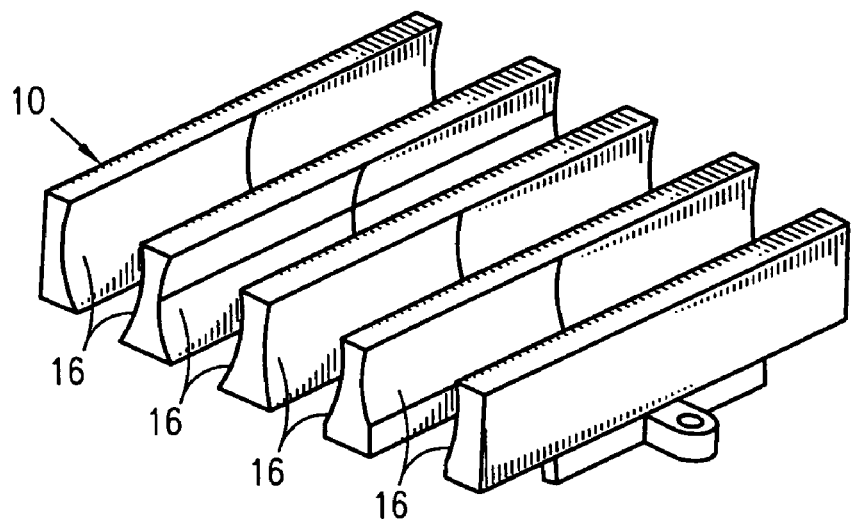
FIG. 3 is an isometric view of the reflector array of FIG. 2, having the LEDs removed.
Figure 4:
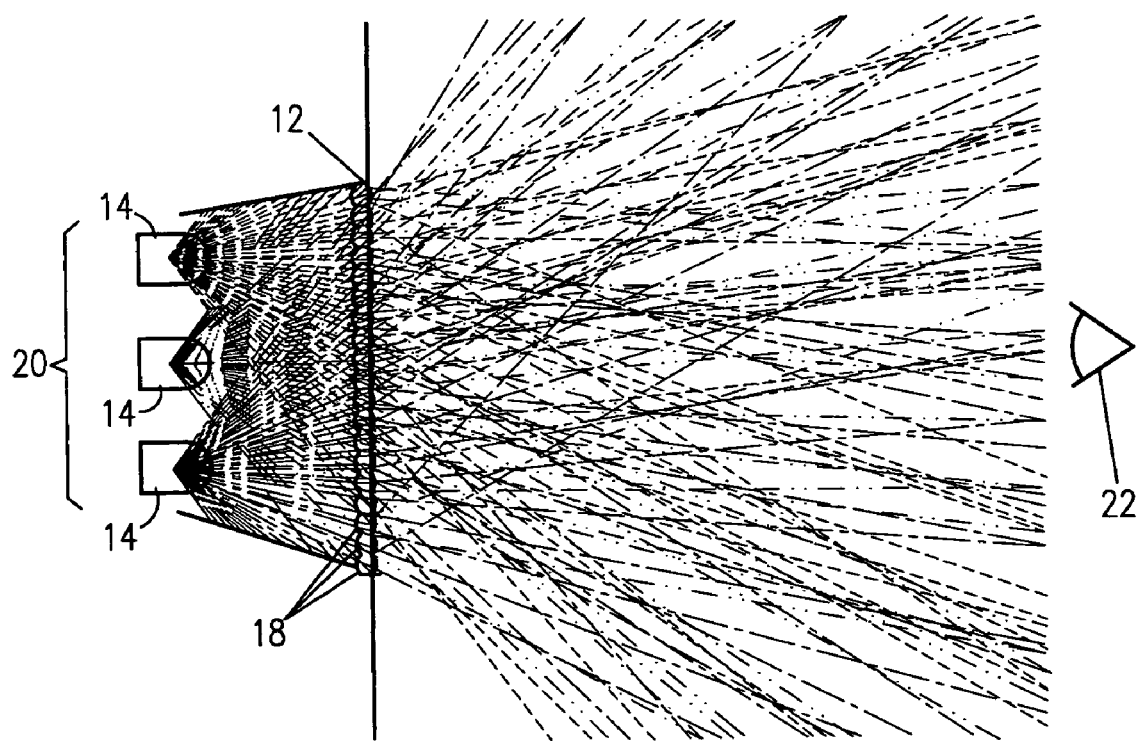
FIG. 4 is a top view of an optical system according to an example embodiment of the present invention.

FIG. 1 is a side cross-section of a portion of a lighting fixture, which schematically illustrates a reflector array 10, a transparent cover or lens 12 and an LED light source 13 including LEDs 14. As best seen in FIGS. 1, 3 and 4, an example reflector array 10 includes rows of reflective and refractive surfaces 16. The LED light source 13 includes an array of the LEDs 14 arranged in rows 17. Each row 17 of LEDs 14 is positioned adjacent to one or more reflective and refractive surfaces 16, which are curved and/or flat, and are arranged to collect light emitted from the each row 17 of the LEDs 14 and to shape and direct the light for passage through the lens 12. The lens 12 is shaped to provide favorable refraction and reflection of the light beams so that, upon entering water, the beams are directed to give generally even illumination of the pool or spa walls and floor while presenting reduced spot intensity from an LED 14.

It should be appreciated that light rays emanate from each LED 14 in a generally conical pattern, which is not suitable for illuminating the walls and floor of either a swimming pool or spa. In the illustrated embodiment, the LEDs 14 are arranged in an array of horizontal rows 17. Rays from each row impinge on reflective surfaces 16 which shape the beam of light emanating from the array.

As shown, a combination of reflected, refracted and direct rays then impinges on the lens 12. The lens 12 is shaped so that rays traveling upward are refracted only slightly and rays traveling downwards are disturbed minimally. Rays are restricted in upward angle to minimize the light that is lost out the top of the water surface. The rays pass through the lens 12 and are refracted again at the lens/water interface. The lens 12 can be made of any suitable material, including plastic, glass, or the like.

The rays then pass through the water to the walls and floor of the pool or spa. If the lighting fixture was not submersed, the beam pattern would be different. The combination of the reflective surfaces 16, and the lens 12 submersed in water, serve to correct the light rays emerging from the LED source 14 in such a way as to reduce hot spots and give more even illumination of the walls and floor.

FIG. 4 shows a top view in which the reflector array 10 has been removed for the sake of clarity. The lens 12 is constructed so as to have numerous vertical projections or ribs 18 that serve to refract the rays horizontally. As shown in FIG. 4, a plurality of vertically extending projections or ribs 18 provided on the inside surface of the lens 12. A row 20 of three LEDs 14R, 14G, 14B of different colors or wavelengths, for example red, green and blue, is shown in which the light emitted is being refracted horizontally by the lens 12. This further shapes the beam to match the walls and floor of the pool or spa. The refraction also causes rays from several LEDs in each row 20 to arrive at a typical eye position of an observer 22, if one is positioned to see into the lighting fixture. The effect is one of "smearing" the light horizontally and creating a much larger apparent source. This decreases apparent intensity to a more comfortable level.

As a result of the optical effects described above with reference to the reflector array 10 and the lens 12, the light intensity emanating from the light fixture is reduced to a comfortable level by optically increasing the area of the light source. The LED array is a large light source which is shaped by the reflector array to match the pool or spa cross section. Minimal light is lost out of the upper water surface. The lens 12 is shaped to refract the light towards the desired wall and floor surfaces to minimize bright and dark spots.

Figure 5:
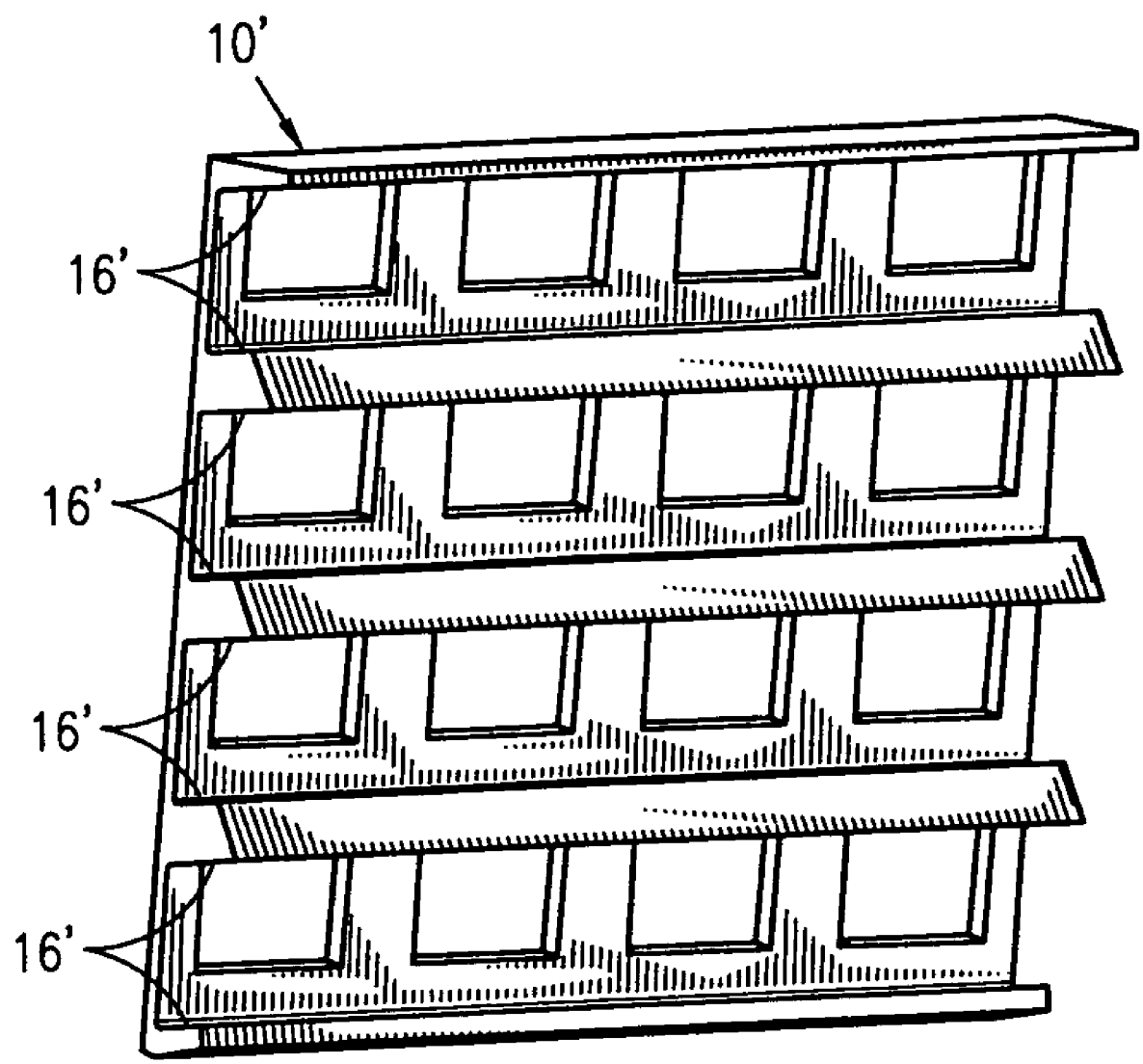
FIG. 5 is a perspective view of a reflector array according to an example embodiment of the present invention.

FIG. 5 shows a reflector array 10' according to an alternative embodiment of the present invention. The reflector array 10' includes reflective and refractive surfaces 16'. It should be appreciated that other reflector arrays having differently shaped reflective and refractive surfaces can be provided according to the present invention.

According to an example embodiment, a lighting fixture according to the present invention includes two circuit boards on which LEDs and their power and control circuitry are provided. One circuit board contains the LEDs and their current drivers and current-sourcing Darlington transistors, along with other associated electrical components. The other board contains rectifier and voltage regulation circuitry, a microcontroller or microprocessor, and two multiplexers or serial-to-parallel converters. The boards are joined by two 24-pin headers that are soldered to each board. The headers act as stand-offs, separating the two boards.

Individual LEDs are switched on and off by the current-sourcing Darlington transistors. The transistors are controlled by the microcontroller via the serial-to-parallel converters. An LED is turned on when the base of its current-sourcing transistor is switched from a positive voltage to ground by its serial-to-parallel converter. Conversely, an LED is turned off when the base of its current-sourcing transistor is switched from ground to the positive voltage. Each LED's anode is connected to a current-sourcing transistor and its cathode connected to ground.

The number of LEDs of a particular color that are simultaneously turned on determines the intensity of that color. Individual LEDs are turned on and off as necessary to vary the intensity of each color and, therefore, the overall color that is produced by the present invention. All on-and-off switching of the LEDs occurs at frequencies perceptible to the human eye.

The example embodiment of the present invention can sequentially change the colored light that it produces. Such color sequencing is achieved by turning on and off LEDs according to a routine performed by the microcontroller. The microcontroller uses a lookup table in performing the routine. The lookup table contains numerical values that represent the on or off states of the LEDs at various points in the sequence.

Figure 6:
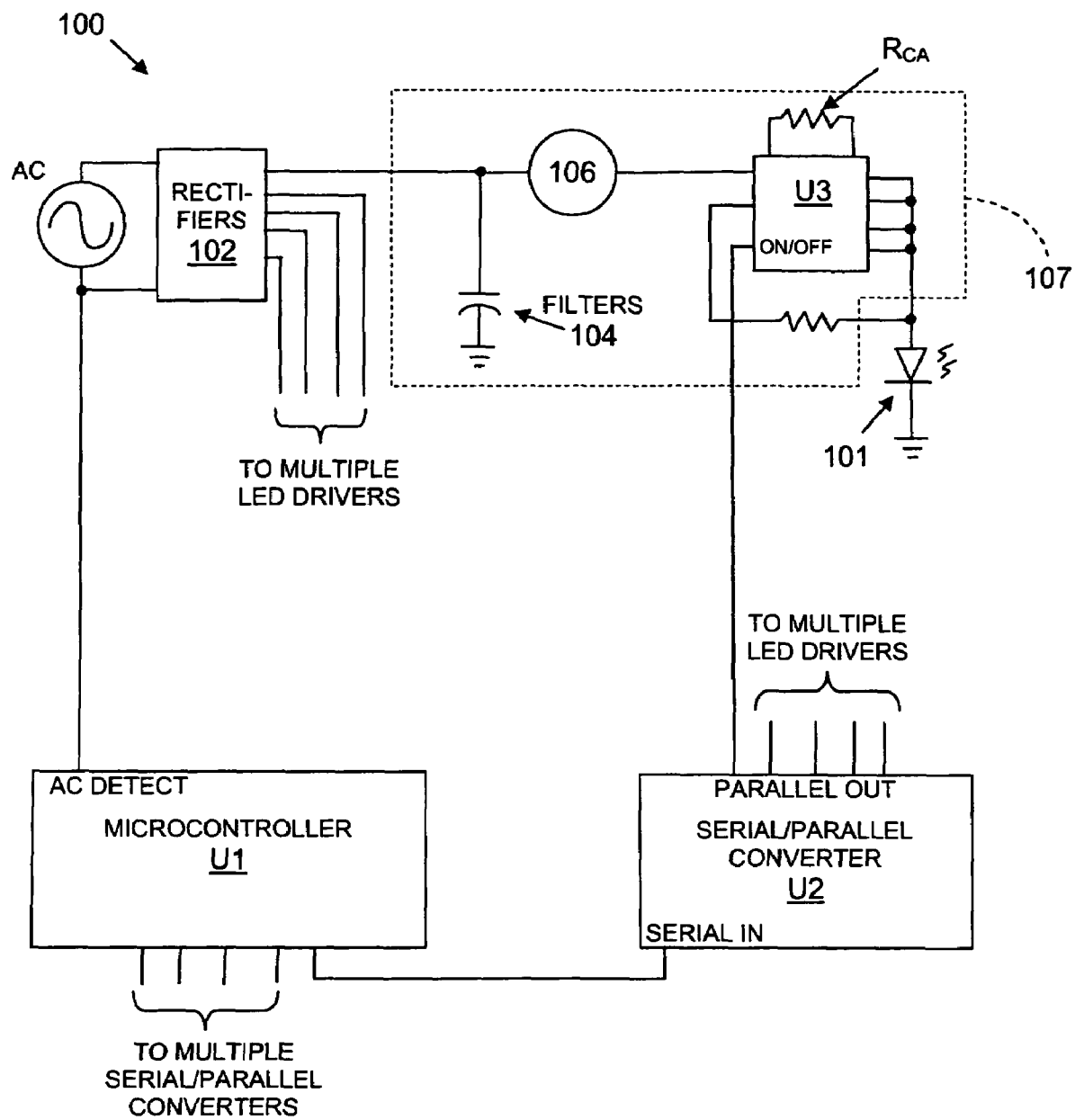
FIG. 6 is a schematic illustration of a control circuit for LEDs according to an example embodiment of the present invention.

FIG. 6 shows a control circuit 100 for controlling a plurality of LEDs 101. The circuit can be used for pool and spa lights and landscaping lights or wherever light output control of LEDs is desired. For pool and spa applications, the light will illuminate the pool or spa walls with a variety of colors of light provided by combining red, blue, and green LEDs.

The circuit 100 according to an example embodiment of the present invention controls an array of LEDs 101 by turning individual LEDs 101 on and off, while providing the required current and voltage to the LED(s) 101 presently turned on. A microcontroller or microprocessor U1 receives color output value/mode selection commands by means of AC (alternating current) line changes. Further, an AC line input is rectified by a rectifier section 102 which feeds each of a number of LED driver circuits 107. Each driver circuit 107 includes a filter capacitor 104, a step-down constant voltage circuit 106 and a constant current driver U3. The filter capacitor 104 filters the AC output from the rectifier section 102 and applies it to the step-down circuit 106, which provides the necessary current to the constant current driver U3. Each of the constant current drivers U3 can be configured for specific voltages or current differences based upon the particular requirement of the LED 101 connected thereto. For example, the value of a current adjust resistor RCA is selected to cause the constant current driver U3 to provide the appropriate current for the LED 101 connected thereto.

In the embodiment of FIG. 6, the constant current driver U3 of each LED driver circuit 107 is switched on or off by one or more serial-to-parallel converters U2. The microcontroller U1 outputs a serial word that represents which LEDs 101 are to be switched on or off, for the color output currently selected. The microcontroller U1 controller its output to provide a variety of different static and dynamic color shows based on the commands it receives. For example, any combination of red, blue or green LEDs 101 can be powered on or off with this method. The circuit 100 is fully scalable to control more or less LEDs 101 by connecting the microcontroller U1 to more or less serial-to-parallel converters U2, which in turn can be connected to more or less current drivers U3.

By turning on more or less LEDs of a particular color, the circuit 100 according to the example embodiment of the present invention effectively controls the intensity of light that is output of a particular color without controlling the duty cycle or otherwise controlling the intensity of individual LEDs. The circuit 100 provides a constant current via an analog controlled current source.

According to another aspect of the present invention, an example embodiment includes fade-in and fade-out control of the LEDs. Fade-in is achieved by selectively turning on individual LEDs at different times. Similarly, fade-out is achieved by selectively turning off individual LEDs at different times. The present invention further includes capacitors for the soft starting and stopping of each individual LED. Each current-sourcing Darlington transistor has a capacitor connected to its base for the soft starting and stopping its associated LED. The capacitor respectively discharges and charges over time when the microcontroller, through the serial-to-parallel converter, attempts to turn the LED on and off, which results in the soft starting and stopping of the LED.

Figure 7:
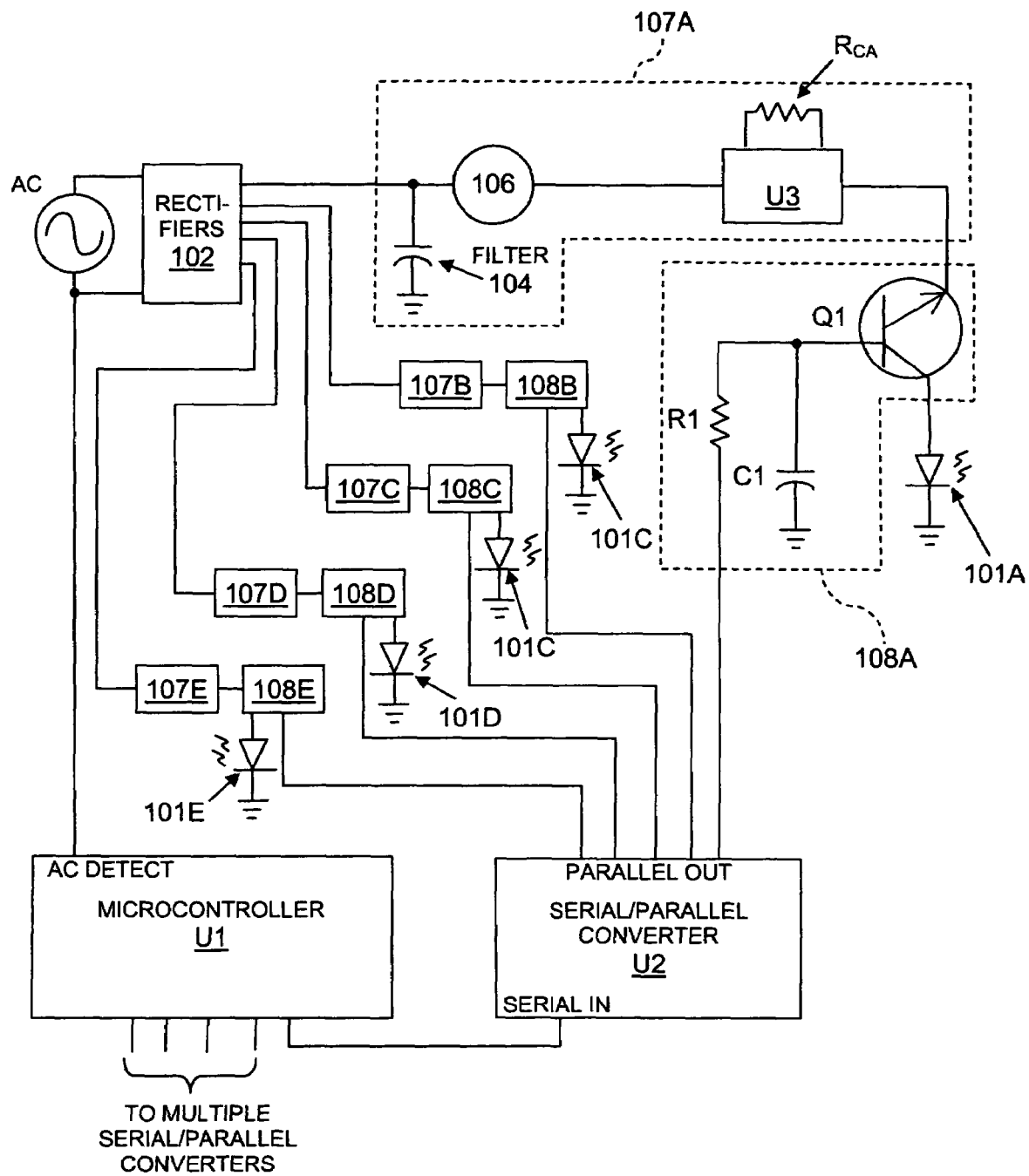
FIG. 7 is a schematic illustration of a control circuit for LEDs including a soft start function according to an example embodiment of the present invention.

Specifically, as shown in FIG. 7, a control circuit 100' includes an LED driver 107A-107E and a ramping circuit 108A-108E for each of a plurality of LEDs 101A-101E. The LED drivers 107A-107E operate similarly to the LED driver circuit 107 described above with respect to the embodiment of FIG. 6. Differences between the example embodiment of FIG. 7 and the embodiment of FIG. 6 will become more apparent from the following disclosure. Further, more specific details of operation will be discussed below with reference to an exemplary LED 101A, an exemplary LED driver 107A, and an exemplary ramping circuit 108A. Additionally, while the LED drivers 107B-107E and the ramping circuits 108B-108E are each shown schematically in FIG. 7 as simple boxes, it should be appreciated that each of the LED drivers 107B-107E, each of the ramping circuits 108B-108E and each of the LEDs 101B-101E operate substantially the same as the exemplary LED driver 107A, ramping circuit 108A and the associated LED 101A.

The LED driver and ramping circuit 108A causes the LED 101A to turn on slowly and to turn off slowly. The ramping circuit 108A includes a transistor Q1, resistor R1 and capacitor C1. The ramp up and down of the current is a fixed time selected by component values. The ramping of LEDs 101 as perceived by the human eye is a soft start and a soft stop of the individual LEDs. This circuit receives a constant current from the linear constant current source U3 and provides the current to the LEDs 101 at a ramp rate set by the resulting time constant based on the value of the resistor R1 and the value of the capacitor C1. The current output of the transistor Q1 is controlled by R1 and C1 output. Each LED 101 has its own ramping circuit 108A. The individual LED selection is done by the microcontroller U1 and the serial to parallel converter U2 (see FIG. 6). The number of LEDs required to be controlled will dictate the number of components required. Additional serial to parallel converters U2, LED driver circuits and ramping circuits can be added as more LEDs are required.

Figure 8:
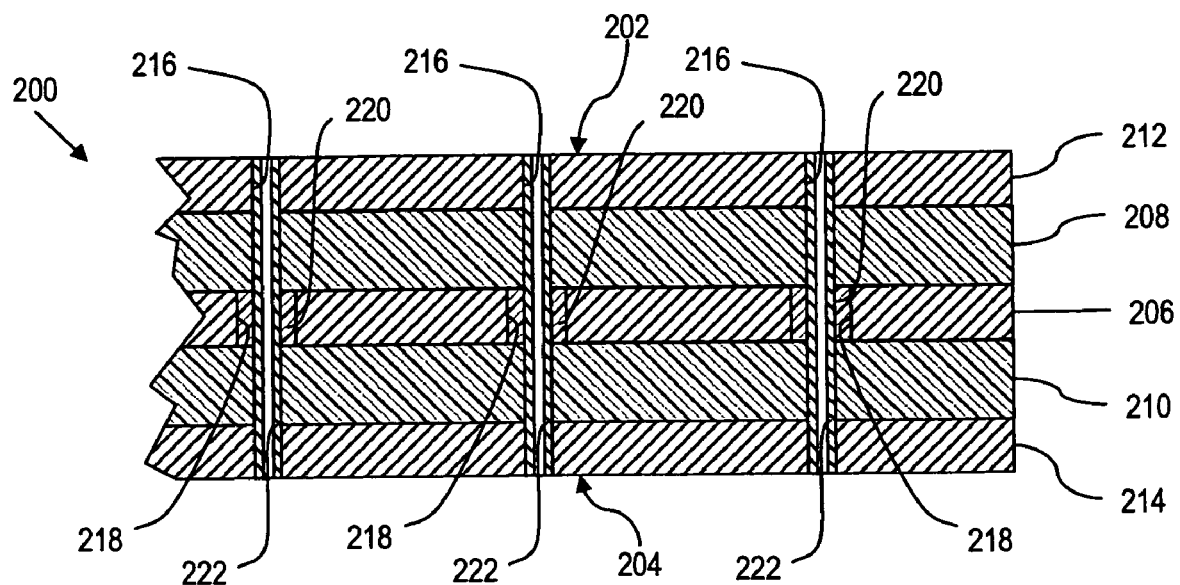
FIG. 8 is a broken sectional view of a metal core circuit board according to an example embodiment of the present invention.

FIG. 8 illustrates a multilayer metal-core circuit board 200, according to the present invention, for providing thermal management for optimal performance of LEDs. The circuit board 200 accommodates heat generating electrical components on both sides. For example, LEDs can be provided on one side 202 of the circuit board 200 and control, driver or other circuits on the other side 204. According to the present invention, the circuit board 200 has a heat-dissipating metal core 206, made of copper for example, that is sandwiched between two thermally-conductive dielectric substrates or layers 208, 210. The dielectric substrates 208, 210 can be made from any suitable material having suitable electrically insulating or dielectric properties and having a sufficient thermal conductivity, for example greater than 1 W/m-° C. An example of a suitable material is "T-preg 1KA Dielectric" available from Laird Technologies of Cleveland, Ohio which as a thermal conductivity of approximately 3 W/m-° C.

An electrically conductive layer 212, 214, such as a copper foil, is provided on the outside of each dielectric substrate 208, 210. The electrically conductive layers 212, 124 can be etched using photoresistive or other suitable conventional etching techniques to form conductive circuit traces.

According to the example embodiment, the top electrically conductive layer 212 supports LEDs and the bottom electrically conductive layer 214 supports the control and driver circuits. Plated through-holes or "via" holes 216 are provided for connection of components from the LED side 202 to the controller/driver circuit side 204 thru the metal core 206.

Figure 8A:
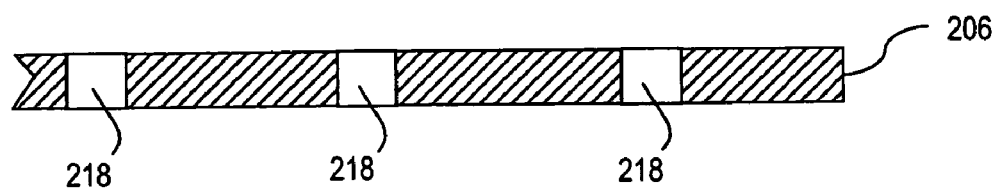
FIGS. 8a-8d illustrate steps in an example process of producing the metal core circuit board of FIG. 8.

FIGS. 8a-8d illustrate an example process for producing the circuit board 200 shown in FIG. 8. First, as shown in FIG. 8a, core holes 218 are drilled in the metal core 206. The core holes 218 have diameters that are larger than the desired diameter of the through-holes 216. An electrically insulating resin or other material, for example "T-preg" available from Laird Technologies of Cleveland, Ohio, is applied to both sides of the metal core 206.

Figure 8B:
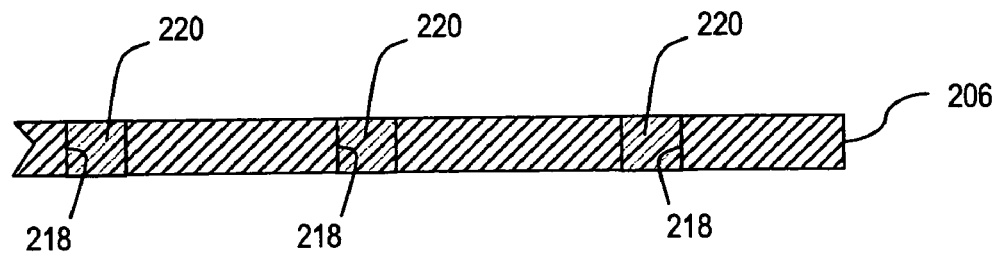

Next, as shown in FIG. 8b, the electrically insulating material 220 fills the core holes 218 drilled in the metal core 206. The application also results in a thin coating (not shown) of the insulating material on both sides of the metal core 206.

Figure 8C:
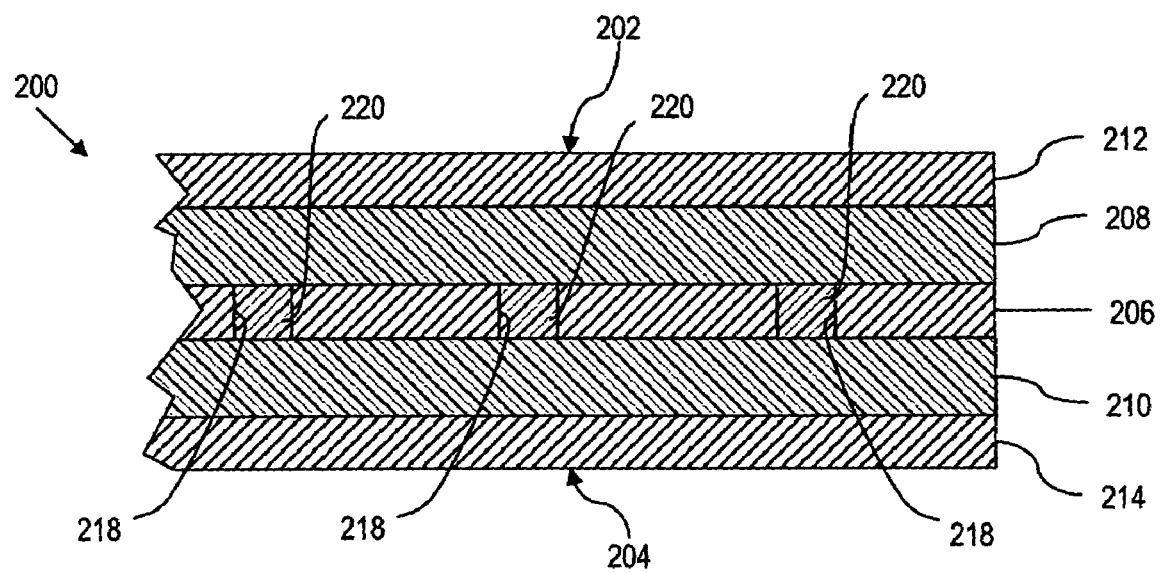

As shown in FIG. 8c, the metal core 206 is then assembled with the other layers 208-214 in any appropriate order. For example, the first dielectric substrate 208 is bonded to a first side of the metal core 206 using an appropriate adhesive. The second dielectric substrate 210 is similarly bonded to a second side of the metal core 206. The first electrically conductive layer 212 is bonded to the exposed side of the first dielectric substrate 208 using an appropriate adhesive. Similarly, the second electrically conductive layer 214 is bonded to the exposed side of the second dielectric substrate 210.

Figure 8D:
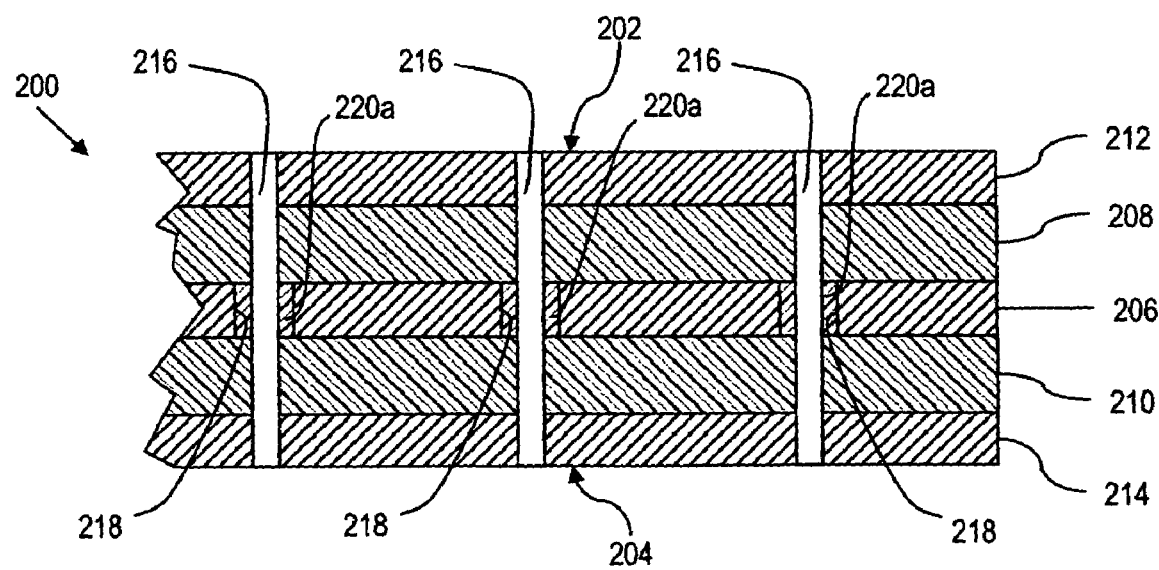

Next, as shown in FIG. 8d, the through-holes 216 are then drilled in the metal core board 200 at the same locations as the core holes 218 that were drilled in the metal core 206, but with a drill bit having a smaller diameter. Each of the cores holes 18, which is now filed with the electrically insulating material 220, circumscribes a corresponding one of the core holes 218. As shown, the through-hole extends through the first electrically conductive layer 212, the first dielectric substrate 208, the metal core 206, the second dielectric substrate 210, and the second electrically conductive layer 214. Generally tubular-shaped insulating layers or electrical insulators 220a are formed from the electrically insulating material 220 left in the core holes 218.

Finally, as shown in FIG. 8, the through-holes 216 are then filled with conductive solder 222 that plates the inside of the through-holes 216, connecting the LED side 202 to the controller/driver circuit side 204 of the circuit board 200. The metal core 206 remains electrically isolated from the conductive solder 222 by the electrical insulators 220a. Each of the electrical insulators 220a is positioned inside of one of the through-holes 216 and is interposed between the metal core 206 and the conductive solder 222.

In the illustrated embodiment, the conductive solder 222 acts as a conductor for electrically connecting the first electrically conductive layer 212 to the second electrically conductive layer 214. As an alternative to the conductive solder 222, a wire or other conductor can be inserted through the through-hole 216 and connected between the first electrically conductive layer 212 and the second electrically conductive layer 214. Further, the wire or other conductor can be provided with an insulating sheath, which eliminates the need for both the solder 222 and the electrical insulators 220a.

Further, according to an example embodiment of the present invention, commands for controlling the lighting fixture according to the present invention are communicated to a controller through power interruptions on a supply power line. The controller responds to the commands that it receives to control the LEDs. Multiple lighting fixtures according to the present invention that are connected to the same supply power will receive the same commands through power interruptions and will respond in the same way. Examples of controlling lighting fixtures by using power interruptions can be found in U.S. Pat. Nos. 6,002,216 and 6,379,025, which are incorporated herein by reference.

Figure 9:
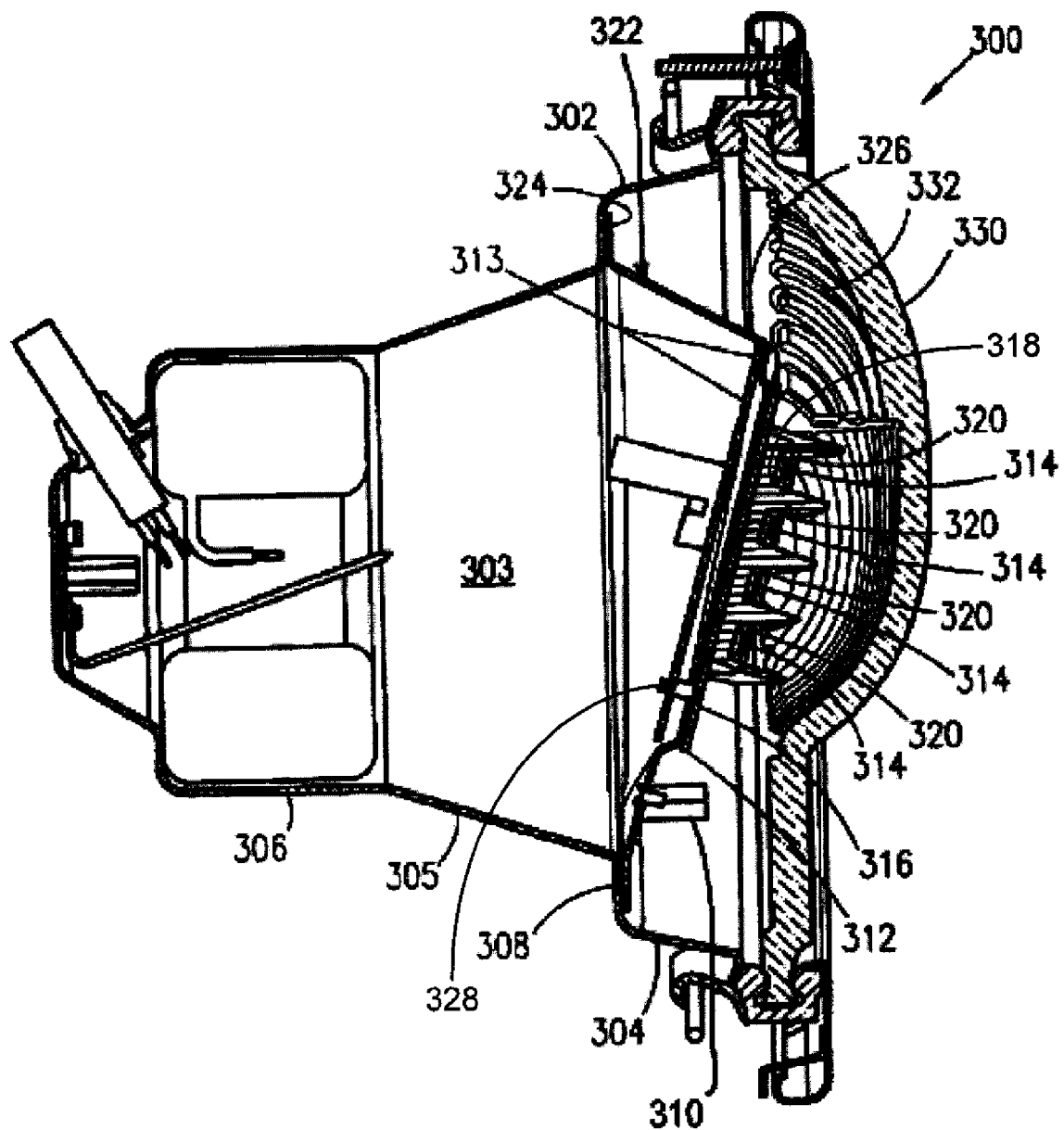
FIG. 9 is a sectional view of an underwater pool lighting fixture according to an example embodiment of the present invention.
Figure 10:
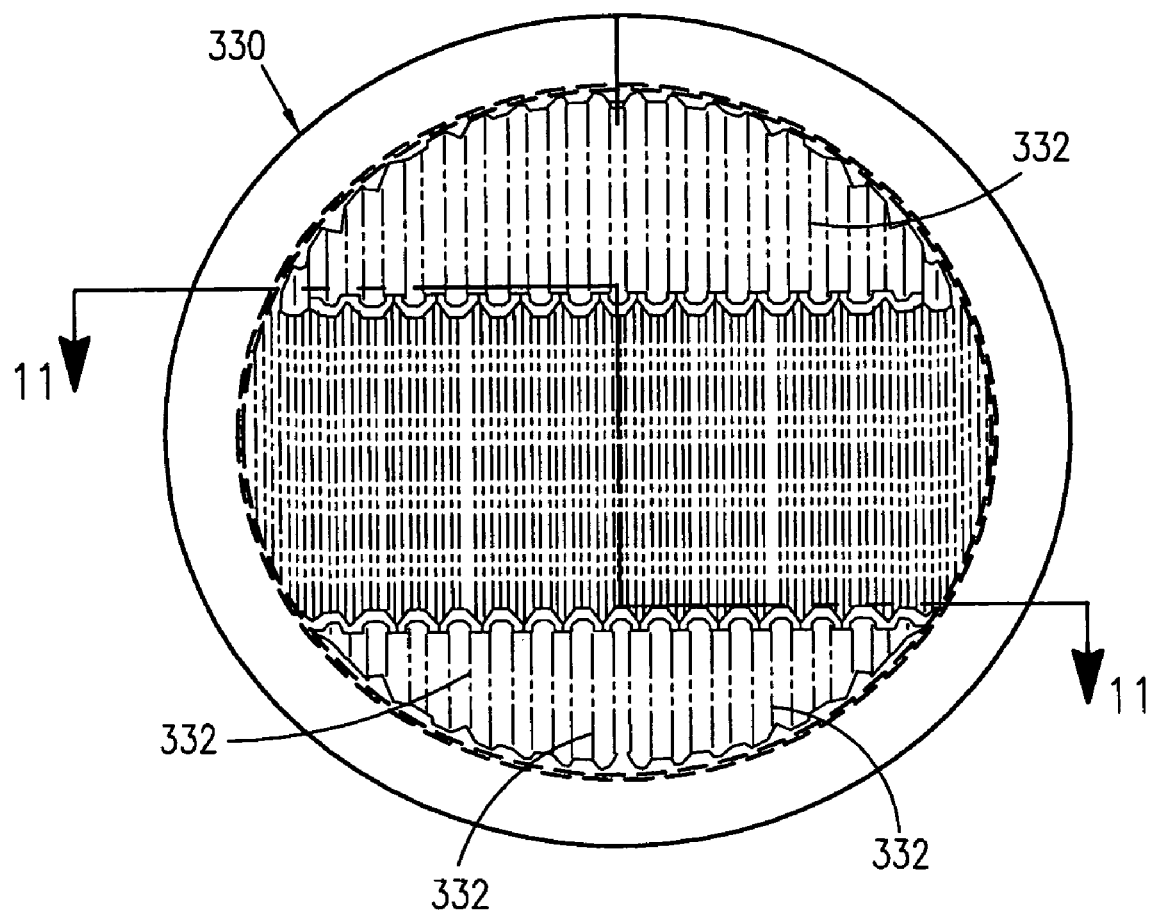
FIG. 10 is a front view of the light fixture of FIG. 9 showing a lens thereof.
Figure 11:
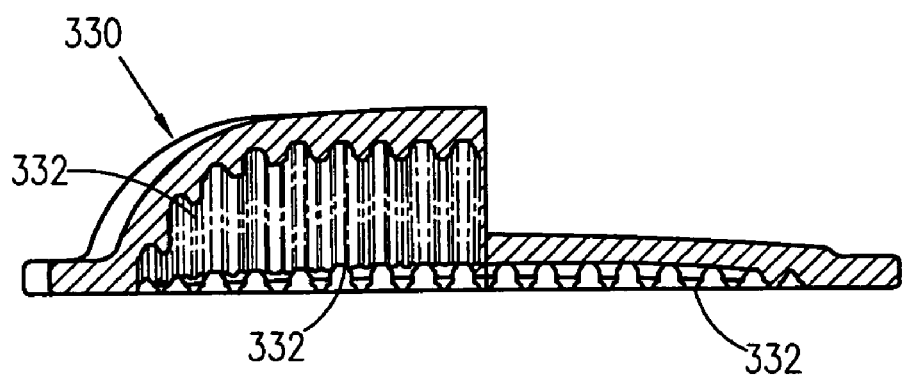
FIG. 11 is a sectional view of the lens of FIG. 10 taken along section line 11-11 in FIG. 10.

As shown in FIGS. 9-11, according to a further example embodiment of the present invention, an underwater lighting fixture 300 includes a metal housing 302 which defines an interior cavity. The housing 302 has a front portion 304, a middle portion 305 and a rear portion 306. The front portion 304 is generally cylindrical and the rear portion 306 is also generally cylindrical, but has a smaller diameter. The middle portion 305 is generally frustoconical. The front and middle portions 304, 305 are joined by a step portion 308. The step portion 308 is provided with four forwardly projecting posts 310.

The lighting fixture 300 further includes a first generally rectangular circuit board 312 and a second generally rectangular circuit board 313. The first circuit board 312 contains a plurality of LEDs 314 and a portion of a control circuit that selectively provides power to the LEDs 314. For example, the first circuit board could include the LED driver 107 shown in FIG. 6 or the LED drivers 107A-107E with the ramping circuits 108A-108E shown in FIG. 7. The first circuit board 312 is a metal core printed circuit board similar to the metal core board 200 shown and described above with reference to FIG. 8. The LEDs 314 are mounted on one face 316 of the circuit board 312. The second circuit board contains other components of the control circuit, for example the rectifiers 102, the microcontroller U1, and the multiplexers U2 shown in FIGS. 6 and 7.

A reflector array 318 similar to the reflector array 10 shown and described above with reference to FIGS. 1-3 is mounted on the same face 316 of the board where the LEDs 314 are mounted. The reflector array 318 has the form of a grid and the LEDs 314 are located in openings 320 of the grid.

The lighting fixture 300 also includes a heat sink 322. The heat sink 322 has a first mounting portion or flange 324 and a second mounting portion or flange 326. The first mounting flange 324 is generally circular and has four holes (not shown) corresponding to the four posts 310 of the housing 302. The first mounting flange 324 is secured to an inside surface of the step portion 308 of the housing 302 using the posts 310 or, alternatively, by another suitable method of attachment. The second mounting flange 326 is generally rectangular. The first circuit board 312 and the second circuit board 313 are mounted on opposite sides of the second mounting flange 326. The first circuit board 312 and second circuit board 313 are connected electrically by pins of a 60-pin header 328 that are soldered to each board 312, 313. The header 328 also acts as a stand-off, physically separating the two boards 312, 313.

When the lighting fixture 300 is operated while submerged in water, heat generated by the LEDs 314 and the heat-generating components of the control circuit is conducted through the metal core of the first circuit board 312 to the heat sink 322. Heat that may be generated by components attached to the second circuit board 313 is also conducted to the heat sink 322. The heat sink 322 then conducts the heat to the housing 302, which conducts the heat to the water that is surrounding the housing 302. The heat is dissipated very quickly in the water since the total volume of water contained by a swimming pool or a spa is quite large as compared to the lighting fixture 300.

A transparent cover or lens 330 is attached to the front portion 304 of the housing 302. The lens extends across and covers a generally circular opening defined by the front portion 304. The lens 330 is similar to the lens 12 shown in FIG. 4. The lens 330 has a series of vertically projections or ribs 332 that serve to refract light rays emitted from the LEDs 314 in a horizontal direction, as explained above with regard to FIG. 4.

Figure 12:
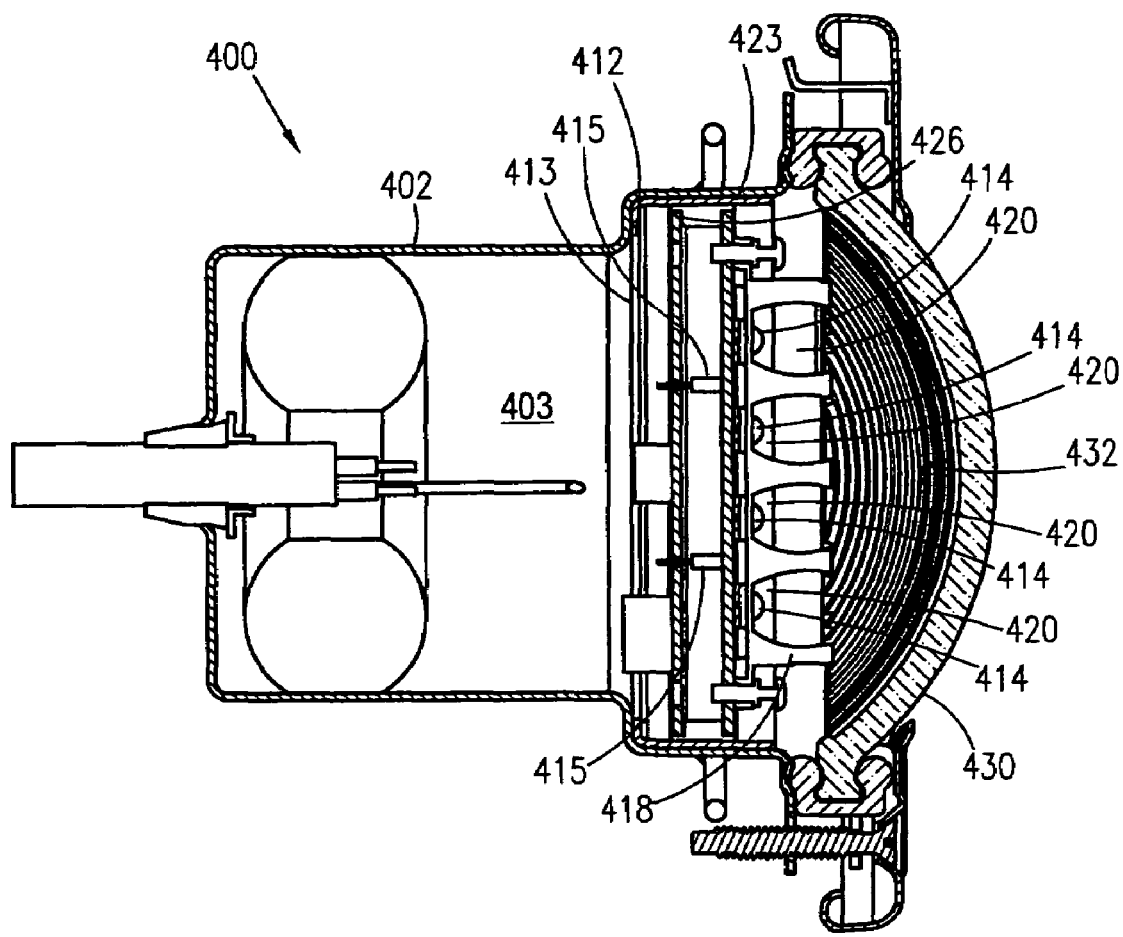
FIG. 12 is a sectional view of an underwater spa lighting fixture according to an example embodiment of the present invention.
Figure 13:
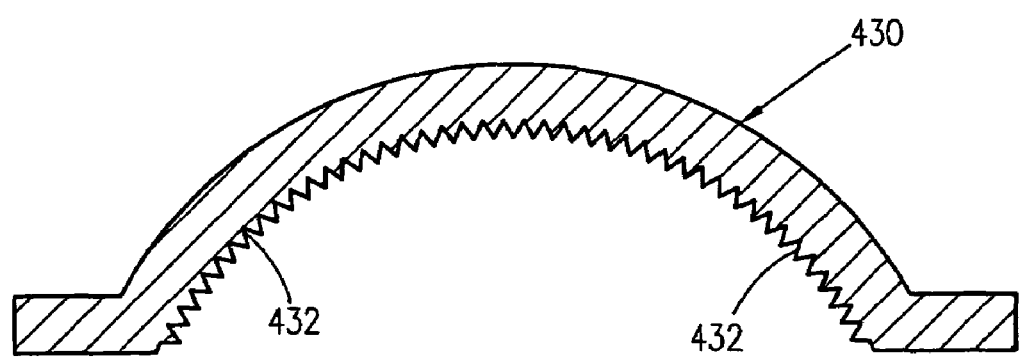
FIG. 13 is a sectional view showing details of the lens of the lighting fixture shown is FIG. 12.

FIGS. 12 and 13 illustrate another underwater lighting fixture 400 according to a further embodiment of the present invention. The lighting fixture 400 has is similar in arrangement to the lighting fixture 300 shown in FIGS. 9-11. A housing 402 is substantially smaller than the housing 302 of the lighting fixture 300 of FIGS. 9-11, and therefore many of the components of the lighting fixture 400 have been modified to fit into the smaller housing.

The lighting fixture 400 includes a housing 402 having an interior cavity 403 (similar to the interior cavity 303 of lighting fixture 300 in FIG. 9). Within the interior cavity 403, the lighting fixture 400 also includes a first generally circular circuit board 412 and a second generally circular circuit board 413. The first circuit board 412 contains an array of LEDs 414 and other electrical components. The first circuit board 412 and second circuit board 413 are electrically connected by two 24-pin headers 415 that are soldered to each board 412, 413. The headers 415 also act as stand-offs, physically separating the two boards 412, 413.

A reflector array 418 is mounted on the first circuit board 412 with the LEDs 414. The reflector array 418 has the form of a grid and the LEDs 414 are located in openings 420 of the grid.

A heat sink 423 has a first mounting portion or mounting flange 426 to which the first and second circuit boards 412, 413 are mounted. The heat sink 423 has a generally cylindrical sidewall, which serves as a second mounting portion and is sized to fit snuggly within the housing 402. A heat transfer compound is provided between the sidewall and the housing 402 to improve heat transfer from the heat sink 422 to the housing 402.

A lens 430 is attached to the housing 402. The lens 430 has a series of vertically projections or ribs 432 that serve to refract light rays emitted from the LEDs 414 in a horizontal direction, as explained above with regard to the lens 12 of FIG. 4.

It should be evident that this disclosure is by way of example and that various changes may be made by adding, modifying or eliminating details without departing from the fair scope of the teaching contained in this disclosure. The invention is therefore not limited to particular details of this disclosure.

What is claimed is:

1. A lighting fixture comprising:
   a housing having an interior cavity and an opening;
   a transparent cover attached to the housing and covering the opening;
   a heat sink including a first mounting portion and a second mounting portion, the first mounting portion being attached to the housing within the interior cavity, the second mounting portion having a first side and a second side opposite the first side;
   a first circuit board mounted to the first side of the second mounting portion;
   a lighting assembly including an LED light source, the LED light source including a plurality of LEDs mounted to the first circuit board; and
   a second circuit board mounted to the second side of the second mounting portion, the second circuit board including at least of portion of a control circuit, the control circuit being operatively connected to the LED light source for selectively providing power to each of the plurality of LEDs,
   the lighting fixture operating while the housing is submerged in water such that heat generated by the LEDs and the control circuit is conducted to the heat sink, the heat sink conducts the heat to the housing, and the housing conducts the heat to the water.

2. The lighting fixture of claim 1, further comprising a header including a plurality of pins for electrically connecting the first circuit board and second circuit board.

3. The lighting fixture of claim 2, wherein the header further acts as a stand-off for physically separating the first circuit board from the second circuit board.

4. A lighting fixture comprising:
   a housing having an interior cavity and an opening;
   a transparent cover attached to the housing and extending across the opening of the housing; and
   a light source projecting a beam of light toward the opening, the beam including first light rays projecting upward toward the transparent cover and second light rays projecting downward toward the transparent cover, wherein the transparent cover is shaped to cause the second light rays to be refracted less than the first light rays.

5. The lighting fixture of claim 4, wherein the lighting fixture is mounted in a pool or spa containing water so that at least some of the first light rays are projecting toward a top surface of the water, and wherein at least some of the second light rays are projecting toward a bottom surface or floor of the pool or spa.

6. The lighting fixture of claim 4, further comprising a reflector, wherein the light source comprises an LED light source including a plurality of LEDs.

7. A lighting fixture comprising:
   a housing having an interior cavity and an opening;
   a transparent cover attached to the housing and extending across the opening of the housing, the transparent cover including a plurality of vertically extending projections distributed across a surface of the transparent cover; and
   a plurality of light source for projecting a beam of light toward the opening; wherein the projections are shaped to cause the beam of light to be refracted horizontally.

8. The lighting fixture of claim 7, further comprising a plurality of light sources arranged in a horizontal row for projecting a beam of light toward the opening, a first one of the plurality of light sources emitting first light waves and a second one of the plurality of light sources emitting second light waves having a wavelength that is different from a wavelength of the first light waves.

9. The lighting fixture of claim 8, wherein the projections are shaped to cause the first light waves and the second light waves to be refracted horizontally for producing a beam of light including the first light waves and the second light waves.

10. The lighting fixture of claim 7, wherein the light source includes a reflector.

11. A lighting fixture comprising:
a housing having an interior cavity and an opening; a transparent cover attached to the housing and extending across the opening of the housing;
a reflector array including a plurality of reflectors, each of the plurality of reflectors including a first open end, a second open end, and first and second reflective surface each extending between the first open end and the second open end, the first reflective surface facing the second reflective surface; and
a light source comprising a plurality of rows of LEDs each including a plurality of LEDs, each of the rows projecting light into the first open end of an associated one of the plurality of reflectors, wherein the light projected by each row of LEDs is reflected by the first and second reflective surfaces of the associated reflector causing the light to pass through the second open end of the associated reflector and through the transparent cover.

12. The lighting fixture of claim 11, wherein each of the first and second reflective surfaces is concave.

13. The lighting fixture of claim 11, wherein the light source cooperates with the reflector array to project a beam of light toward the opening of the housing, the beam including first light rays projecting upward toward the transparent cover and second light rays projecting downward toward the transparent cover, and wherein the transparent cover is shaped to cause the second light rays to be refracted more than the first light rays.

14. A lighting fixture comprising:
a housing having an interior cavity and an opening;
a transparent cover attached to the housing and covering the opening;
a lighting assembly including an LED light source, the LED light source include a plurality of LEDs; and
a control circuit operatively connected to the LED light source for selectively providing power to each of the plurality of LEDs, the control circuit including:
a microcontroller having an input connected to sense an alternating current source and a plurality of outputs for controlling the plurality of LEDs;
a plurality of multiplexers each having a plurality of outputs and an input connected to one of the plurality of outputs of the microcontroller; and
a plurality of electronic switches each having a control input and a power output, each power output being connected to selectively power one of the plurality of LEDs, each of the control inputs being connected to one of the plurality of outputs of one of the plurality of multiplexers, wherein the microcontroller can individually and selectively control power to each of the plurality of LEDs.

15. The lighting fixture of claim 14, wherein the control circuit further includes a plurality of current drivers, each of the plurality of current drivers including one of the plurality of electronic switches.

16. The lighting fixture of claim 14, further comprising: a first circuit board, the plurality of LEDs being mounted to the first circuit board; and a second circuit board, the control circuit being provided on the second circuit board.

17. The lighting fixture of claim 16, further comprising a header including a plurality of pins for electrically connecting the first circuit board and second circuit board.

18. The lighting fixture of claim 17, wherein the header further acts as a stand-off for physically separating the first circuit board from the second circuit board.

19. The lighting fixture of claim 18, further comprising a heat sink including a first mounting portion and a second mounting portion, the first mounting portion being attached to the housing within the interior cavity, the second mounting portion having a first side and a second side opposite the first side, the first circuit board being mounted to the first side of the second mounting portion, the second circuit board being mounted to the second side of the second mounting portion.

20. The lighting fixture of claim 14, wherein the control circuit further includes plurality of a ramping circuits for selectively ramping up power to one of the plurality of LEDs over a first set period of time and selectively ramping down power to one of the plurality of LEDs over a second set period of time, each of the plurality of ramping circuits including one of the plurality of electronic switches.

21. The lighting fixture of claim 20, wherein each of the plurality of ramping circuits includes a timing circuit for controlling the corresponding electronic switch according to the first set period of time and the second set period of time.

22. The lighting fixture of claim 21, wherein each timing circuit includes a capacitor and a resistor, wherein the first set period of time and the second set period of time are each a function of a capacitance of the capacitor and a resistance of the resistor.

* * * * *